United States Patent
Kim

(10) Patent No.: US 9,691,814 B2
(45) Date of Patent: Jun. 27, 2017

(54) CHIP-ON-FILM (COF) PACKAGE, COF PACKAGE ARRAY INCLUDING THE SAME, AND DISPLAY DEVICE INCLUDING THE SAME

(71) Applicant: Samsung Display Co., Ltd., Yongin, Gyeonggi-d (KR)

(72) Inventor: Dong-Ho Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 39 days.

(21) Appl. No.: 14/255,937

(22) Filed: Apr. 17, 2014

(65) Prior Publication Data

US 2015/0076531 A1    Mar. 19, 2015

(30) Foreign Application Priority Data

Sep. 13, 2013 (KR) .................. 10-2013-0110649

(51) Int. Cl.
  *G06K 9/00* (2006.01)
  *H01L 27/15* (2006.01)
  *H01L 23/498* (2006.01)

(52) U.S. Cl.
  CPC ........ *H01L 27/156* (2013.01); *H01L 23/4985* (2013.01); *H01L 2924/0002* (2013.01)

(58) Field of Classification Search
  CPC .... B41J 2/14209; B41J 2/1609; B41J 2/1623; B41J 2/1632; B41J 2/1643; B41J 2/1646; B41J 2/1642; B41J 2002/14491; B41J 2002/14362

USPC ......... 257/773, 736, 786, E23.025, E23.027; 349/149; 347/69, 50, 68
See application file for complete search history.

(56) References Cited

U.S. PATENT DOCUMENTS

| | | | | |
|---|---|---|---|---|
| 5,528,403 A | * | 6/1996 | Kawaguchi et al. | 349/149 |
| 5,914,763 A | * | 6/1999 | Fujii et al. | 349/149 |
| 5,984,447 A | * | 11/1999 | Ohashi | B41J 2/14209 310/345 |
| 6,211,936 B1 | * | 4/2001 | Nakamura | 349/152 |
| 6,414,741 B2 | * | 7/2002 | Hasegawa et al. | 349/187 |
| 7,459,789 B2 | * | 12/2008 | Kim et al. | 257/773 |

(Continued)

FOREIGN PATENT DOCUMENTS

| | | |
|---|---|---|
| JP | 2008-124317 A | 5/2008 |
| KR | 10-0652519 B1 | 12/2006 |

(Continued)

*Primary Examiner* — Mary Wilczewski
*Assistant Examiner* — Tsz Chiu
(74) *Attorney, Agent, or Firm* — Lewis Roca Rothgerber Christie LLP

(57) ABSTRACT

A chip-on-film (COF) package includes a base film, an integrated circuit chip, and a plurality of signal interconnections. The base film includes a bonding region and a non-bonding region. The integrated circuit chip is at the non-bonding region. Each of the plurality of signal interconnections is coupled to the integrated circuit chip and extend to the bonding region along a first direction. The plurality of signal interconnections are spaced from each other along a second direction substantially crossing the first direction. The plurality of signal interconnections alternate on a first surface and a second surface opposite to the first surface of the base film along the second direction.

23 Claims, 6 Drawing Sheets

(56) References Cited

U.S. PATENT DOCUMENTS

| | | | | |
|---|---|---|---|---|
| 7,968,798 | B2* | 6/2011 | Oota | H05K 1/0224 |
| | | | | 174/254 |
| 8,050,467 | B2* | 11/2011 | Yang | G06K 9/00026 |
| | | | | 382/124 |
| 8,705,261 | B2* | 4/2014 | Ito et al. | 365/63 |
| 2003/0007042 | A1* | 1/2003 | Lu | B41J 2/17526 |
| | | | | 347/86 |
| 2004/0130602 | A1* | 7/2004 | Watanabe | B41J 2/14209 |
| | | | | 347/68 |
| 2005/0241758 | A1* | 11/2005 | Kim et al. | 156/308.2 |
| 2006/0017778 | A1* | 1/2006 | Okuno | B41J 2/14209 |
| | | | | 347/50 |
| 2007/0222077 | A1* | 9/2007 | Ogihara et al. | 257/758 |
| 2008/0110666 | A1* | 5/2008 | Oota | 174/254 |

FOREIGN PATENT DOCUMENTS

| | | |
|---|---|---|
| KR | 10-2009-0127678 A | 12/2009 |
| KR | 10-2012-0042079 A | 5/2012 |

\* cited by examiner

CHIP-ON-FILM (COF) PACKAGE, COF PACKAGE ARRAY INCLUDING THE SAME, AND DISPLAY DEVICE INCLUDING THE SAME

CROSS-REFERENCE TO RELATED APPLICATION

This patent application claims priority to and the benefit of Korean Patent Application No. 10-2013-0110649, filed on Sep. 13, 2013 in the Korean Intellectual Property Office, the content of which is hereby incorporated by reference in its entirety.

BACKGROUND

1. Field

Embodiments of the present disclosure relate to a chip-on-film (COF) package, a COF package array including the same, and a display device including the same. More particularly, embodiments of the present disclosure relate to a COF package capable of reducing or preventing shorts (e.g., short circuits) between adjacent signal interconnections, a COF package array including the same, and a display device including the same.

2. Description of the Related Art

A display device includes a display panel, a printed circuit board driving the display panel, and a tape carrier package (TCP) or chip-on-film (COF) package electrically coupling the display panel to the printed circuit board.

The COF package has a relatively smaller thermal expansion coefficient and excellent flexibility as compared with the TCP. Additionally, the COF package uses a thinner film and realizes fine pitch. Thus, the use of the COF package has been increasing.

The COF package may include a base film, interconnections disposed on the base film, and an integrated circuit chip disposed on the base film. All of the interconnections may be formed on one surface of the base film. Thus, a short may occur between adjacent interconnections due to a cutting process of separating COF packages, or melting or corrosion of a material of the interconnections.

SUMMARY

Aspects of embodiments of the present disclosure are directed toward a chip-on-film (COF) package capable of reducing or preventing the occurrence of shorts between adjacent signal interconnections.

Aspects of embodiments of the present disclosure are directed toward a COF package array including the COF package.

Aspects of embodiments of the present disclosure provide a display device including the COF package.

A chip-on-film (COF) package according to an embodiment of the present invention includes a base film, an integrated circuit chip, and a plurality of signal interconnections. The base film includes a bonding region and a non-bonding region. The integrated circuit chip is at the non-bonding region. Each of the plurality of signal interconnections is coupled to the integrated circuit chip and extends to the bonding region along a first direction. The plurality of signal interconnections are spaced from each other along a second direction crossing (e.g., substantially perpendicular to) the first direction. The plurality of signal interconnections alternate on a first surface and a second surface opposite to (e.g., facing oppositely away from) the first surface of the base film along the second direction.

The integrated circuit chip may be on the first surface of the base film.

The plurality of signal interconnections may include a first signal interconnection and a second signal interconnection. The first signal interconnection may be on the first surface of the base film. The second signal interconnection may be spaced from the first signal interconnection along the second direction. The second signal interconnection may be on a portion of the first surface of the base film and a portion of the second surface of the base film.

The first signal interconnection and the second signal interconnection may extend to opposite sides of the base film (i.e., the sides facing away from each other) along the first direction.

The first signal interconnection and the second signal interconnection may alternate along (i.e., may be alternately located along) the second direction.

The second signal interconnection may include an upper interconnection, a lower interconnection, and a via-electrode. The upper interconnection may be on the first surface of the base film and may be coupled to the integrated circuit chip. The upper interconnection may extend to a portion of the bonding region. The lower interconnection may be on the second surface of the base film. The lower interconnection may extend to a remaining portion of the bonding region along the first direction. The via-electrode may penetrate the base film to couple the upper interconnection to the lower interconnection.

The COF package may further include a first protection layer and a second protection layer. The first protection layer may be on the first surface of the base film and may cover the first signal interconnection and the upper interconnection. The second protection layer may be on the second surface of the base film and may cover the lower interconnection.

The first protection layer may have an exposure groove exposing at least a portion of the first signal interconnection at the bonding region and at least a portion of the upper interconnection at the bonding region.

A display device according to an embodiment of the present invention includes a display panel configured to display an image, a printed circuit board configured to drive the display panel, and a chip-on-film (COF) package coupling the display panel to the printed circuit board. The COF package includes a base film, an integrated circuit chip, and a plurality of signal interconnections. The base film includes a bonding region and a non-bonding region. The integrated circuit chip is at the non-bonding region. Each of the plurality of signal interconnections is coupled to the integrated circuit chip and extends to the bonding region along a first direction. The plurality of signal interconnections are spaced from each other along a second direction crossing (e.g., substantially perpendicular to) the first direction. The plurality of signal interconnections alternate on a first surface and a second surface opposite to the first surface of the base film along the second direction.

The integrated circuit chip may be on the first surface of the base film.

The plurality of signal interconnections may include a first signal interconnection and a second signal interconnection. The first signal interconnection may be on the first surface of the base film. The second signal interconnection may be spaced from the first signal interconnection along the second direction. The second signal interconnection may be on a portion of the first surface of the base film and a portion of the second surface of the base film.

The first signal interconnection and the second signal interconnection may extend to opposite sides of the base film along the first direction.

The first signal interconnection and the second signal interconnection may alternate along the second direction.

The second signal interconnection may include an upper interconnection, a lower interconnection, and a via-electrode. The upper interconnection may be on the first surface of the base film and may be coupled to the integrated circuit chip. The upper interconnection may extend to a portion of the bonding region. The lower interconnection may be on the second surface of the base film. The lower interconnection may extend to a remaining portion of the bonding region along the first direction. The via-electrode may penetrate the base film to couple the upper interconnection to the lower interconnection.

The display device may further include a first protection layer and a second protection layer. The first protection layer may be on the first surface of the base film and may cover the first signal interconnection and the upper interconnection. The second protection layer may be on the second surface of the base film and may cover the lower interconnection.

The first protection layer may have an exposure groove exposing at least a portion of the first signal interconnection at the bonding region and at least a portion of the upper interconnection at the bonding region.

A chip-on-film (COF) package array according to an embodiment of the present invention includes a plurality of COF packages spaced from each other and a dummy part. The dummy part surrounds a periphery of each of the plurality of COF packages. Each of the plurality of COF package includes a base film, an integrated circuit chip, and a plurality of signal interconnections. The base film includes a bonding region and a non-bonding region. The integrated circuit chip is at the non-bonding region. Each of the plurality of signal interconnections is coupled to the integrated circuit chip and extends to the bonding region along a first direction. The plurality of signal interconnections are spaced from each other along a second direction crossing (e.g., substantially perpendicular to) the first direction. The plurality of signal interconnections alternate on a first surface and a second surface opposite to the first surface of the base film along the second direction.

The plurality of COF packages and the dummy part may be a single body.

The integrated circuit chip may be on the first surface of the base film.

The plurality of signal interconnections may include a first signal interconnection and a second signal interconnection. The first signal interconnection may be on the first surface of the base film. The second signal interconnection may be spaced from the first signal interconnection along the second direction. The second signal interconnection may be on a portion of the first surface of the base film and a portion of the second surface of the base film.

The second signal interconnection may include an upper interconnection, a lower interconnection, and a via-electrode. The upper interconnection may be on the first surface of the base film and may be coupled to the integrated circuit chip. The upper interconnection may extend to a portion of the bonding region. The lower interconnection may be on the second surface of the base film. The lower interconnection may extend to a remaining portion of the bonding region along the first direction. The via-electrode may penetrate the base film to couple the upper interconnection to the lower interconnection.

The dummy part may include a dummy film and a dummy interconnection. The dummy film and the base film may be a single body. The dummy interconnection and the lower interconnection may be a single body.

BRIEF DESCRIPTION OF THE DRAWINGS

The above and other features and characteristics of the present disclosure will become more readily apparent with reference to the following detailed description when considered in conjunction with the accompanying drawings wherein.

DETAILED DESCRIPTION

Figure 1A:
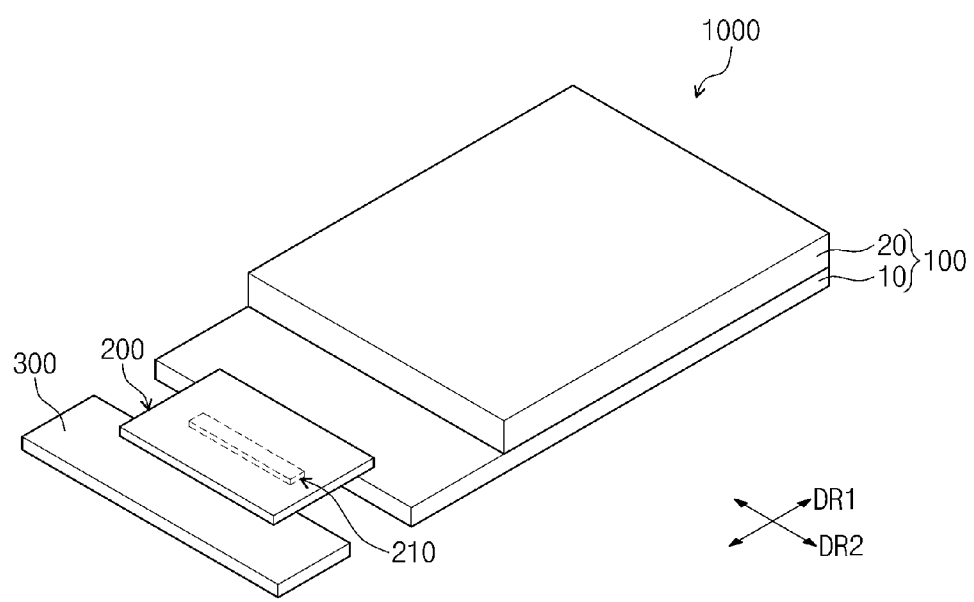
FIG. 1A is a perspective view showing a display device according to an example embodiment of the present disclosure.

It will be understood that when an element or layer is referred to as being "on", "connected to", or "coupled to" another element or layer, it can be directly on, connected, or coupled to the other element or layer or intervening elements or layers may be present. In contrast, when an element is referred to as being "directly on", "directly connected to", or "directly coupled to" another element or layer, there are no intervening elements or layers present. Like numbers refer to like elements throughout. As used herein, the term "and/or" includes any and all combinations of one or more of the associated listed items. Further, the use of "may" when describing embodiments of the present invention refers to "one or more embodiments of the present invention."

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" may encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be explained in detail with reference to the accompanying drawings.

Figure 1B:
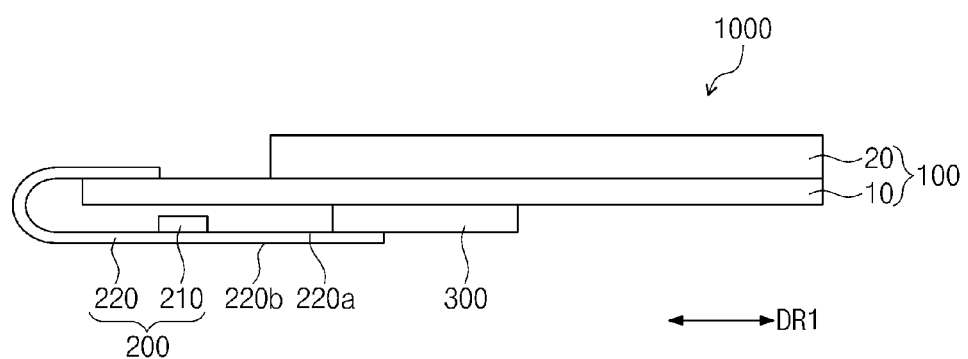
FIG. 1B is a cross-sectional view of a display device shown in FIG. 1A.

FIG. 1A is a perspective view showing a display device 1000 according to an example embodiment of the present disclosure, and FIG. 1B is a cross-sectional view of the display device 1000.

Referring to FIGS. 1A and 1B, the display device 1000 includes a display panel 100, a chip-on-film (COF) package 200, and a printed circuit board 300.

The display panel 100 may be one of various display panels such as an organic light emitting display panel, a liquid crystal display panel, a plasma display panel, an electrophoretic display panel, and an electrowetting display panel. Hereinafter, the display panel 100 as the organic light emitting display panel will be described as an example.

The display panel 100 may display (e.g., may be configured to display) an image. The display panel 100 may include a first substrate 10 and a second substrate 20.

The first substrate 10 may include a plurality of gate lines, a plurality of data lines, and a plurality of pixels arranged in a matrix form by the gate lines and the data lines (e.g., the plurality of gate lines and the plurality of data lines may extend in substantially perpendicular directions with respect to each other). The first substrate 10 may have a wider area (e.g., a larger surface area) than that of the second substrate 20 when viewed from a plan view. A pad electrode may be formed on a portion of the first substrate 10 that does not overlap with the second substrate 20. The pad electrode may be connected to (e.g., bonded to) the COF package 200. The pad electrode may be coupled to (e.g., electrically connected to) the COF package 200. A signal outputted from the COF package 200 and a signal outputted from the printed circuit board 300 may be transmitted to the display panel 100 through the pad electrode.

The second substrate 20 may be connected to (e.g., bonded to) the first substrate 10 to seal the pixels, the gate lines, and the data lines from the outside.

The display panel 100 may further include a polarization film on (e.g., adhered to) one surface of the second substrate 20. The polarization film may suppress or reduce external light reflection.

The display device 1000 may further include a gate driver and a data driver. Each of the gate and data drivers may be mounted on any one of the display panel 100, the COF package 200, and the printed circuit board 300. Alternatively, an additional chip including each of the gate and data drivers may be provided in the display device 1000. The gate driver may provide gate signals to the gate lines, and the data driver may provide data voltages to the data lines.

The COF package 200 may couple (e.g., may electrically connect) the display panel 100 to the printed circuit board 300. The COF package 200 may include a base film 220 and an integrated circuit chip 210 formed on the base film 220.

An end along a first direction DR1 of the COF package 200 may be coupled to (e.g., bonded to) the pad electrode, so that the COF package 200 may be electrically coupled to the display panel 100. Another end along the first direction DR1 of the COF package 200 may be physically or mechanically coupled to (e.g., bonded to) and electrically coupled to the printed circuit board 300.

The number of the COF package 200 may be variously changed in the display device 1000.

The COF package 200 may be installed on the display panel 100 in a state of being bent in a C-shape. The COF package 200 may extend from a top surface along a sidewall onto a bottom surface of the first substrate 10. To achieve this, the COF package 200 may be flexible. The COF package 200 may be fixed on the top surface and the bottom surface of the first substrate 10.

The printed circuit board 300 may perform a function driving the display panel 100. The printed circuit board 300 may include a driving substrate and a plurality of circuit parts mounted on the driving substrate. The printed circuit board 300 may be installed on the bottom surface of the first substrate 10 when the COF package 200 is bent.

Figure 2:
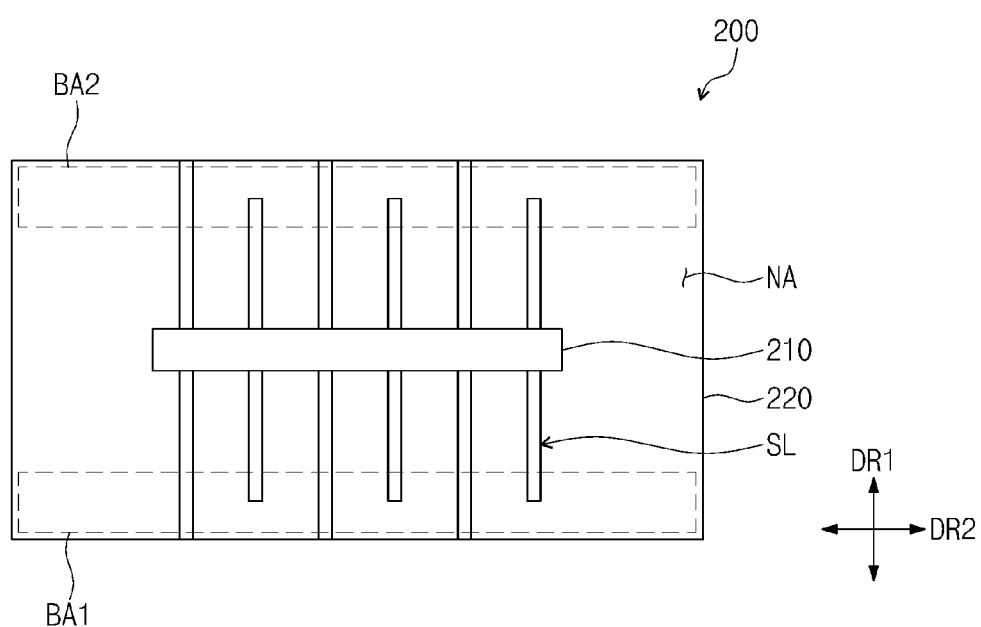
FIG. 2 is a plan view showing a COF package shown in FIG. 1.

FIG. 2 is a plan view showing a COF package shown in FIGS. 1A and 1B.

Referring to FIGS. 1A, 1B, and 2, the COF package 200 may include the base film 220, the integrated circuit chip 210, and signal interconnections SL.

The base film 220 may be formed of, for example, a flexible film. The base film 220 may include a first surface 220a and a second surface 220b, the first and second surfaces 220a and 220b being opposite to each other.

The base film 220 may include a bonding region and a non-bonding region NA. The bonding region may include a first bonding region BA1 and a second bonding region BA2. The first bonding region BA1 may be a region bonded to the display panel 100, and the second bonding region BA2 may be a region bonded to the printed circuit board 300. The first and second bonding regions BA1 and BA2 may correspond to both edge portions (e.g., opposite edge portions) of the COF package 200 along the first direction DR1, respectively. The first bonding region BA1 and the second bonding region BA2 may be spaced (e.g., spaced apart) from each other along the first direction DR1. The display panel 100 and the printed circuit board 300 may be bonded to the first surface 220a of the COF package 200.

The non-bonding region NA may be a region not bonded to the display panel 100 and the printed circuit board 300. The COF package 200 may be bent along a bending axis parallel to the second direction DR2 at a portion of the non-bonding region NA.

The integrated circuit chip 210 may be formed on the first surface 220a of the base film 220. The integrated circuit chip 210 may receive driving power and a driving signal from the printed circuit board 300 through the second bonding region BA2. The integrated circuit chip 210 may generate the gate signal and the data signal in response to (e.g., according to) the driving power and the driving signal. Additionally, the integrated circuit chip 210 may output the gate signal and the data signal to the display panel 100 through the first bonding region BA1.

The signal interconnections SL may be spaced (e.g., spaced apart) from each other along the second direction DR2. Each of the signal interconnections SL may be connected to the integrated circuit chip 210 and extend along the first direction DR1 to overlap with the first bonding region BA1 and the second bonding region BA2. The signal interconnections SL may be formed of a conductive material (e.g., a metal, such as copper).

The signal interconnections SL may be alternately disposed at least one by one along the second direction DR2 at opposite sides along the first direction DR1 on the first and second surfaces 220a and 220b of the base film 220 (e.g., alternately at an end along the first direction DR1 of the first bonding region BA1 and an end along the first direction DR1 of the second bonding region BA2).

A portion of each signal interconnection SL at the first bonding region BA1 may have a substantially similar structure as another portion of each signal interconnection SL at the second bonding region BA2. Thus, the signal interconnections SL formed on the first bonding region BA1 and the configuration thereof will be mainly described hereinafter. In other words, descriptions of the signal interconnections SL formed on the second bonding regions BA1 and the configuration thereof may be omitted.

Figure 3:
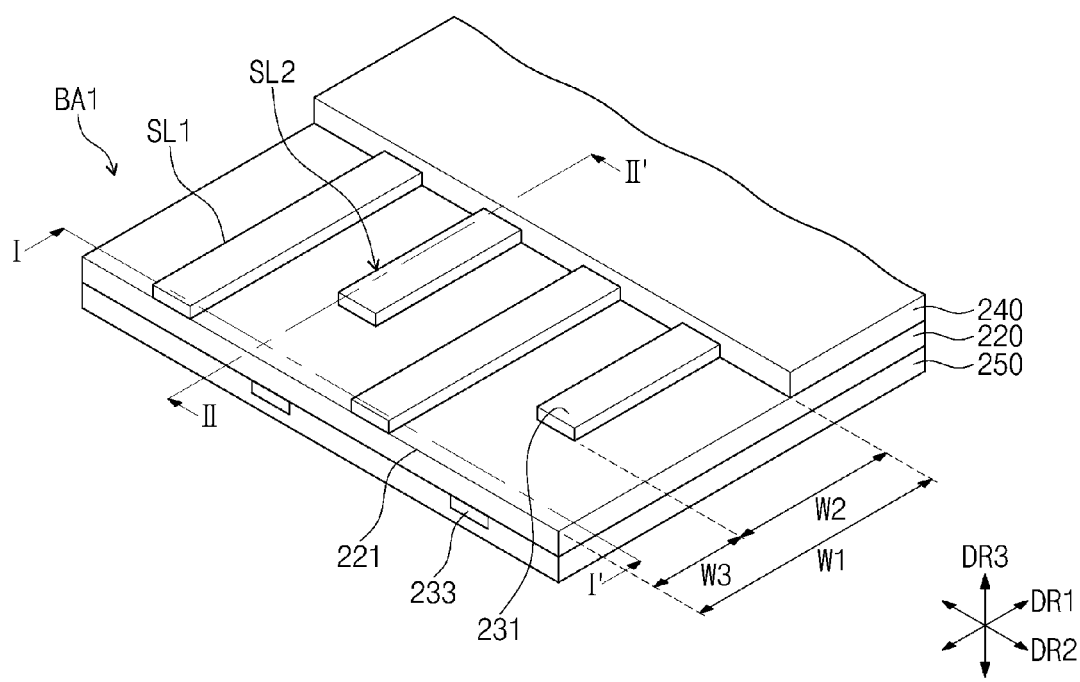
FIG. 3 is a perspective view showing a first bonding region and a circumference thereof in the COF package shown in FIG. 2.
Figure 4:
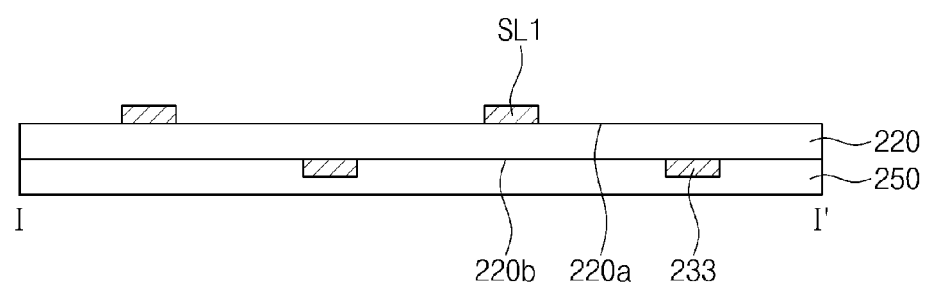
FIG. 4 is a cross-sectional view taken along the line I-I' of FIG. 3.
Figure 5:
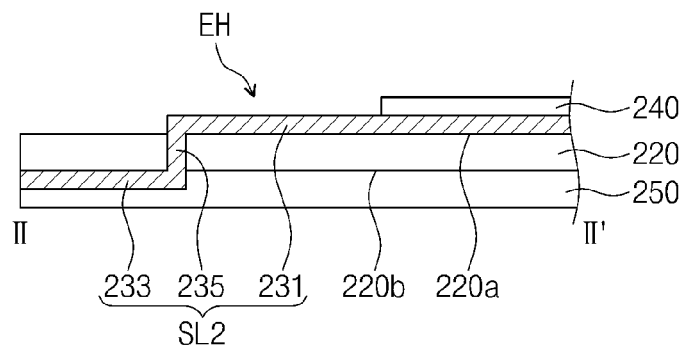
FIG. 5 is a cross-sectional view taken along the line II-II' of FIG. 3.

FIG. 3 is a perspective view showing the first bonding region BA1 and a configuration of the COF package shown in FIG. 2, FIG. 4 is a cross-sectional view taken along the line I-I' of FIG. 3, and FIG. 5 is a cross-sectional view taken along the line II-II' of FIG. 3.

Referring to FIGS. 2 to 5, the signal interconnections SL may include a first signal interconnection SL1 and a second signal interconnection SL2.

The first signal interconnection SL1 may be disposed on a top surface of the base film 220. The first signal interconnection SL1 may be coupled to (e.g., connected to) the integrated circuit chip 210 and extend to one end 221 of the base film 220 along the first direction DR1.

The second signal interconnection SL2 may be spaced from (e.g., spaced apart from) the first signal interconnection SL1 along the second direction DR2. The second signal interconnection SL2 may be disposed on a portion of the first surface 220a of the base film 220 and a portion of the second surface 220b of the base film 220. The portion of the second signal interconnection SL2 on the first surface 220a may be connected to (e.g., physically connected to) the portion of the second signal interconnection SL2 on the second surface 220b.

The second signal interconnection SL2 may include an upper interconnection 231, a lower interconnection 233, and a via-electrode 235.

The upper interconnection 231 may be disposed on the first surface 220a of the base film 220. A width W1 along the first direction DR1 of the first bonding region BA1 includes a width W2 and the remainder, width W3. The upper interconnection 231 may be coupled to (e.g., connected to) the integrated circuit chip 210 and may extend along the first direction DR1 by the width W2 (e.g., may extend along the first direction DR1 across the width W2). In other words, a length along the first direction DR1 of the upper interconnection 231 may be smaller than a distance along the first direction DR1 between the integrated circuit chip 210 and the end 221 of the base film 220.

The lower interconnection 233 may be disposed on the second surface 220b of the base film 220. The lower interconnection 233 may extend along the first direction by a sum of the width W3 and a width of the via-electrode 235 along the first direction DR1.

The via-electrode 235 may penetrate the base film 220 to couple (e.g., to electrically connect) the upper interconnection 231 to the lower interconnection 233. The via-electrode 235 may be formed to overlap with the upper interconnection 231 and the lower interconnection 233 when viewed from a plan view. Additionally, the via-electrode 235 may be formed at (e.g., may overlap with) the first bonding region BA1 when viewed from a plan view.

The first signal interconnection SL1 and the second signal interconnection SL2 may be alternately and repeatedly arranged along the second direction DR2.

The COF package 200 may further include a first protection layer 240 and a second protection layer 250.

The first protection layer 240 may be formed on the first surface 220a of the base film 220 and may cover the first signal interconnection SL1 and the upper interconnection 231. The first protection layer 240 may protect the first signal interconnection SL1 and the upper interconnection 231. The first protection layer 240 may have exposure grooves EH exposing the first signal interconnection SL1 at (e.g., overlapping) the first bonding region BA1 and the second bonding region BA2 and exposing the upper interconnection 231 at (e.g., overlapping) the first bonding region BA1 and the second bonding region BA2. The first signal interconnection SL1 and the upper interconnections 231 may be coupled to (e.g., electrically connected to) the display panel 110 or the printed circuit board 300 of FIG. 1 through the exposure groove EH.

The second protection layer 250 may be formed on the second surface 220b of the base film 220 and may cover the lower interconnection 233. The second protection layer 250 may protect the lower interconnection 233.

The first protection layer 240 and the second protection layer 250 may be formed of an insulating material.

In the present example embodiment, each of the first and second signal interconnections SL1 and SL2 are disposed on both of the first and second bonding regions BA1 and BA2. In other embodiments, the first and second signal interconnections SL1 and SL2 may be formed on either of the first bonding region BA1 or second the bonding region BA2, but only the first signal interconnection SL1 may be formed on the other of the first bonding region BA1 or the second bonding region BA2.

Figure 6:
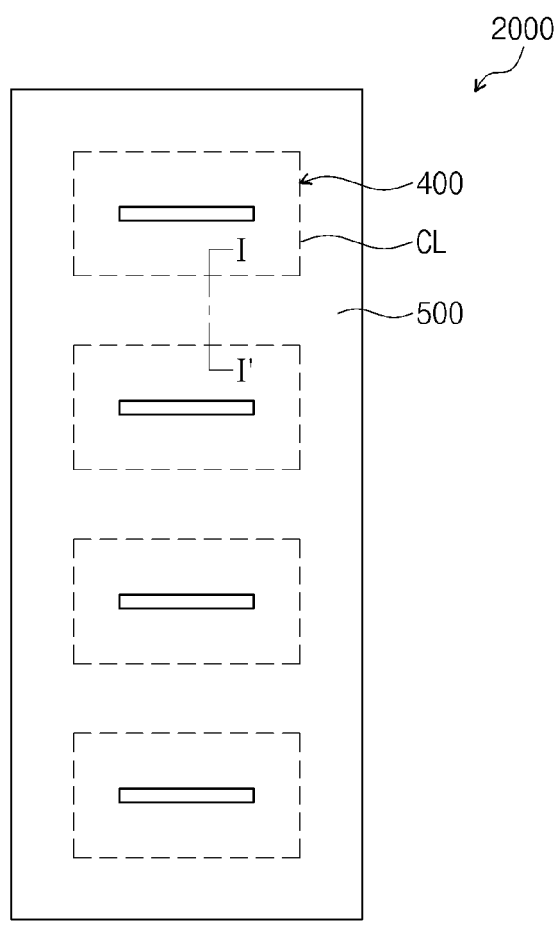
FIG. 6 is a plan view showing a COF package array according to an example embodiment of the present disclosure.
Figure 7:
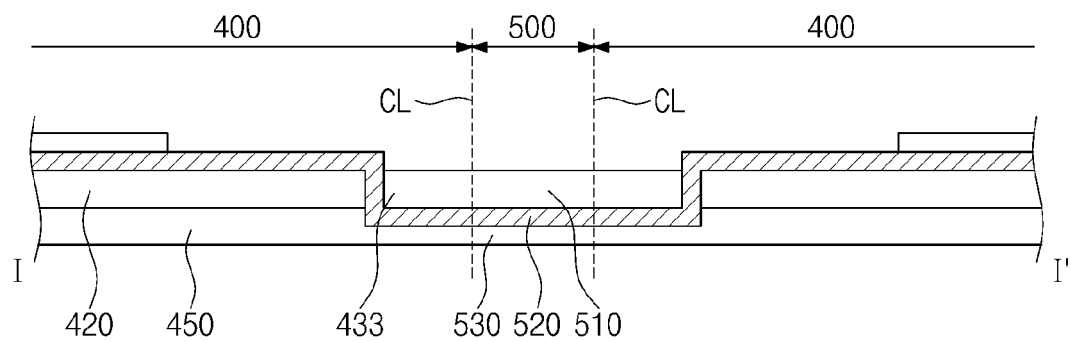
FIG. 7 is a cross-sectional view taken along the line I-I' of FIG. 6.

FIG. 6 is a plan view showing a COF package array according to an example embodiment of the present disclosure, and FIG. 7 is a cross-sectional view taken along the line I-I' of FIG. 6.

Referring to FIGS. 6 and 7, a COF package array 2000 includes a plurality of COF packages 400 spaced (e.g., spaced apart) from each other and a dummy part 500 (e.g., a region without the COF packages).

The COF packages 400 may be separated (e.g., separated from each other) by, for example, a cutting process including cutting the COF package array 2000 along a cutting line CL of the COF package array 2000. Each of the COF packages 400 may be similar to or the same as the COF package 200 described with reference to FIGS. 1 to 5. Thus, the descriptions to the COF package 400 may be omitted.

The dummy part 500 may be disposed between the COF packages 400 and may surround the circumference or the periphery of each of the COF packages 400. The dummy part 500 and the COF packages 400 may be formed as one body (e.g., as one united, integral, or continuous body) in order to provide a plurality of COF package arrays 2000 in a reel form. The dummy part 500 may be removed during the cutting process for separating the COF packages 400 from each other.

The dummy part 500 may include a dummy film 510 (e.g., an inert film), a dummy interconnection 520 (e.g., an inert interconnection), and a dummy protection layer 530 (e.g., an inert protection layer).

The dummy film 510 may be formed of the same material as a base film 420, and the dummy film 510 and the base film 420 may be formed as one body (e.g., as a united, integral, or continuous body).

The dummy interconnection 520 may be disposed on a bottom surface of the dummy film 510. The dummy interconnection 520 may couple (e.g., may connect) lower interconnections 433 of adjacent COF packages 400. The dummy interconnection 520 may be formed of the same material as the lower interconnections 433 of the COF packages 400. The dummy interconnection 520 and the lower interconnections 433 of the COF packages 400 may be formed as one body (e.g., as a united, integral, or continuous body).

The dummy protection layer 530 may be formed on the bottom surface of the dummy film 510 and may cover the dummy interconnection 520. The dummy protection layer 530 may be formed of the same material as a second protection layer 450. The dummy protection layer 530 and the second protection layer 450 may be formed as one body (e.g., as a united, integral, or continuous body).

Figure 8A:
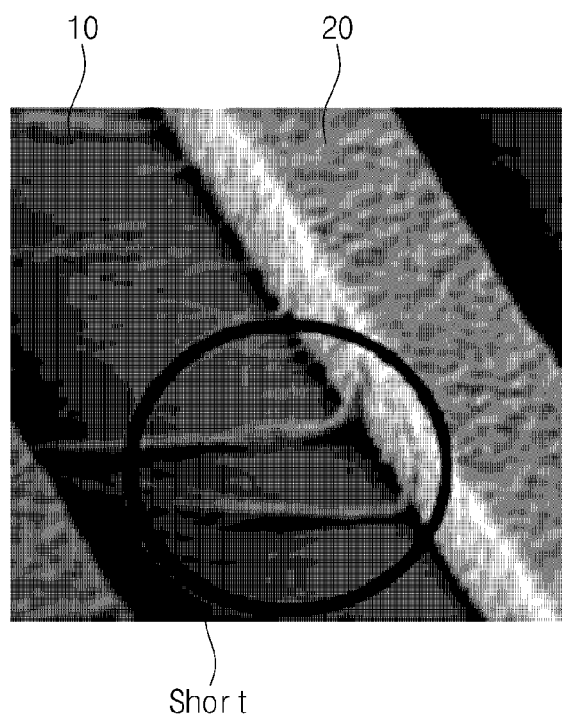
FIGS. 8A and 8B are photographs showing shorts between adjacent signal interconnections in a comparative COF package.
Figure 8B:
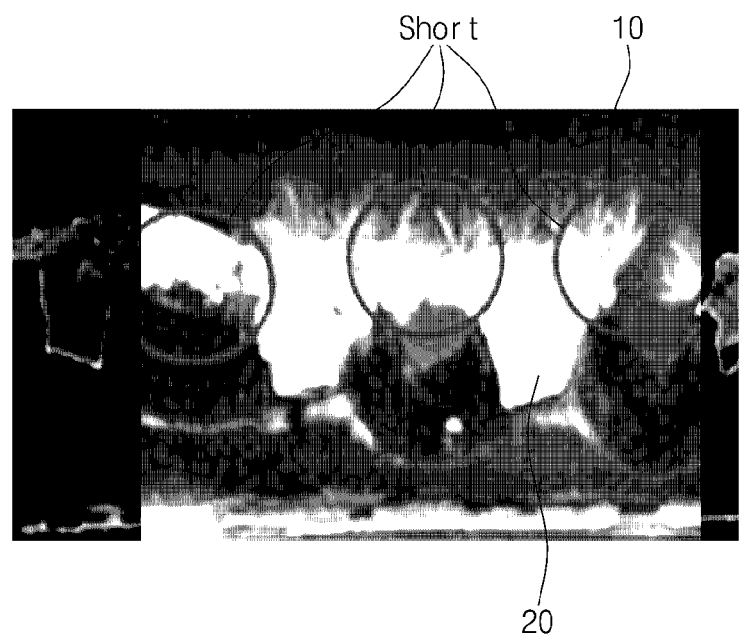
Figure 9:
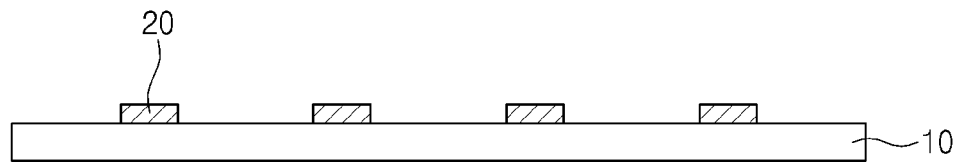
FIG. 9 is a cross-sectional view showing an end portion of a bonding region of a COF package according to a comparative example.

FIGS. 8A and 8B are photographs showing shorts between adjacent signal interconnections in a comparative COF package, and FIG. 9 is a cross-sectional view showing an end portion of a bonding region of a COF package according to the comparative example.

Referring to FIGS. 8A, 8B, and 9, all signal interconnections 20 were formed on one surface of a base film 10 at a cutting surface in a COF package of an comparative example. In the COF package of the comparative example, a short may form or occur between adjacent signal interconnections 20 due to a blunt cutting blade during a cutting process or due to debris remaining after the cutting process. Additionally, a material of the signal interconnections 20 may be melted, may corrode, or may be transformed by various causes during a manufacturing process, such that a short may form or occur between adjacent signal interconnections 20.

According to embodiments of the present invention, the signal interconnections are classified into the plurality of interconnection groups. Each of the interconnection groups includes at least one signal interconnection. The interconnection groups are alternately disposed on the top surface 220a and the bottom surface 220b of the base film 220 at a cutting surface of the COF package. Thus, a likelihood of a short forming between adjacent signal interconnections may be reduced or prevented.

The COF package, the COF package array, and the display according to embodiments of the present invention may reduce or prevent a short forming or occurring between adjacent signal interconnections.

Although example embodiments of the present invention have been described herein, it is understood that the present invention should not be limited to these example embodiments but various changes and modifications can be made by one ordinary skilled in the art within the spirit and scope of the present invention as defined by the following claims and their equivalents.

What is claimed is:

1. A chip-on-film (COF) package comprising:
    a base film formed as a single continuous film and comprising a bonding region and a non-bonding region;
    an integrated circuit chip at the non-bonding region; and
    a plurality of signal interconnections coupled to the integrated circuit chip, each of the plurality of signal interconnections extending to the bonding region along a first direction, and the plurality of signal interconnections spaced from each other along a second direction crossing the first direction,
    wherein the plurality of signal interconnections are alternately on a first surface and a second surface opposite to the first surface of the base film along the second direction with respect to one another, and
    wherein the first surface and the second surface face opposite directions in a third direction crossing the first and second directions.

2. The COF package of claim 1, wherein the integrated circuit chip is on the first surface of the base film.

3. The COF package of claim 2, wherein the plurality of signal interconnections comprise:
    a first signal interconnection on the first surface of the base film; and
    a second signal interconnection spaced from the first signal interconnection along the second direction and on a portion of the first surface of the base film and a portion of the second surface of the base film.

4. The COF package of claim 3, wherein the first signal interconnection and the second signal interconnection extend to opposite sides of the base film along the first direction.

5. The COF package of claim 3, wherein the first signal interconnection and the second signal interconnection are alternately arranged along the second direction.

6. The COF package of claim 3, wherein the second signal interconnection comprises:
    an upper interconnection on the first surface of the base film, coupled to the integrated circuit chip, and extending to a portion of the bonding region;
    a lower interconnection on the second surface of the base film and extending to a remaining portion of the bonding region along the first direction; and
    a via-electrode penetrating the base film to couple the upper interconnection to the lower interconnection.

7. The COF package of claim 6, further comprising:
    a first protection layer on the first surface of the base film and covering the first signal interconnection and the upper interconnection; and
    a second protection layer on the second surface of the base film and covering the lower interconnection.

8. The COF package of claim 7, wherein the first protection layer has an exposure groove exposing at least a portion of the first signal interconnection at the bonding region and at least a portion of the upper interconnection at the bonding region.

9. A display device comprising:
a display panel configured to display an image;
a printed circuit board configured to drive the display panel; and
a chip-on-film (COF) package coupling the display panel to the printed circuit board,
wherein the COF package comprises:
a base film formed as a single continuous film and comprising a bonding region and a non-bonding region;
an integrated circuit chip at the non-bonding region; and
a plurality of signal interconnections coupled to the integrated circuit chip, each of the plurality of signal interconnections extending to the bonding region along a first direction, and the plurality of signal interconnections spaced from each other along a second direction crossing the first direction,
wherein the plurality of signal interconnections are alternately on a first surface and a second surface opposite to the first surface of the base film along the second direction with respect to each other, and
wherein the first surface and the second surface face opposite directions in a third direction crossing the first and second directions.

10. The display device of claim 9, wherein the integrated circuit chip is on the first surface of the base film.

11. The display device of claim 10, wherein the plurality of signal interconnections comprise:
a first signal interconnection on the first surface of the base film; and
a second signal interconnection spaced from the first signal interconnection along the second direction and on a portion of the first surface of the base film and a portion of the second surface of the base film.

12. The display device of claim 11, wherein the first signal interconnection and the second signal interconnection extend to opposite sides of the base film along the first direction.

13. The display device of claim 11, wherein the first signal interconnection and the second signal interconnection are alternately arranged along the second direction.

14. The display device of claim 11, wherein the second signal interconnection comprises:
an upper interconnection on the first surface of the base film, coupled to the integrated circuit chip, and extending to a portion of the bonding region;
a lower interconnection on the second surface of the base film and extending to a remaining portion of the bonding region along the first direction; and
a via-electrode penetrating the base film to couple the upper interconnection to the lower interconnection.

15. The display device of claim 14, further comprising:
a first protection layer on the first surface of the base film and covering the first signal interconnection and the upper interconnection; and
a second protection layer on the second surface of the base film and covering the lower interconnection.

16. The display device of claim 15, wherein the first protection layer has an exposure groove exposing at least a portion of the first signal interconnection at the bonding region and at least a portion of the upper interconnection at the bonding region.

17. A chip-on-film (COF) package array comprising:
a plurality of COF packages spaced from each other; and
a dummy part surrounding a periphery of each of the plurality of COF packages,
wherein each of the plurality of COF packages comprises:
a base film comprising a bonding region and a non-bonding region;
an integrated circuit chip at the non-bonding region; and
a plurality of signal interconnections coupled to the integrated circuit chip, each of the plurality of signal interconnections extending to the bonding region along a first direction, and the plurality of signal interconnections spaced from each other along a second direction crossing the first direction,
wherein the signal interconnections are alternately on a first surface and a second surface opposite to the first surface of the base film along the second direction with respect to each other, and
wherein the first surface and the second surface face opposite directions in a third direction crossing the first and second directions.

18. The COF package array of claim 17, wherein the plurality of COF packages and the dummy part are a single body.

19. The COF package array of claim 17, wherein the integrated circuit chip is on the first surface of the base film.

20. The COF package array of claim 19, wherein the plurality of signal interconnections comprise:
a first signal interconnection on the first surface of the base film; and
a second signal interconnection spaced from the first signal interconnection along the second direction and on a portion of the first surface of the base film and a portion of the second surface of the base film.

21. The COF package array of claim 20, wherein the second signal interconnection comprises:
an upper interconnection on the first surface of the base film, coupled to the integrated circuit chip, and extending to a portion of the bonding region;
a lower interconnection on the second surface of the base film and extending to a remaining portion of the bonding region along the first direction; and
a via-electrode penetrating the base film to couple the upper interconnection to the lower interconnection.

22. The COF package array of claim 21, wherein the dummy part comprises:
a dummy film; and
a dummy interconnection,
wherein the dummy film and the base film are a single body, and
wherein the dummy interconnection and the lower interconnection are a single body.

23. A chip-on-film (COF) package comprising:
a base film formed as a single continuous film and comprising a bonding region and a non-bonding region;
an integrated circuit chip at the non-bonding region;
a plurality of signal interconnections coupled to the integrated circuit chip, each of the plurality of signal interconnections extending to the bonding region along a first direction, and the plurality of signal interconnections spaced from each other along a second direction crossing the first direction, a first portion of the signal interconnections being disposed on a first surface and a second portion of the signal interconnections being disposed on a second surface opposite to the first surface of the base film;

a first protection layer on the first surface of the base film and covering the first portion of the signal interconnections; and a second protection layer on the second surface of the base film and covering the second portion of the signal interconnections, wherein the first surface and the second surface face opposite directions in a third direction crossing the first and second directions, and wherein the first portion of the signal interconnections and the second portion of the signal interconnections are spaced apart from each other in the third direction by the base film.

* * * * *